US012564002B2

(12) United States Patent
Murasawa et al.

(10) Patent No.: US 12,564,002 B2
(45) Date of Patent: Feb. 24, 2026

(54) DIAGNOSTIC DEVICE, SEMICONDUCTOR MANUFACTURING EQUIPMENT SYSTEM, SEMICONDUCTOR EQUIPMENT MANUFACTURING SYSTEM, AND DIAGNOSTIC METHOD

(71) Applicant: Hitachi High-Tech Corporation, Tokyo (JP)

(72) Inventors: Satoshi Murasawa, Tokyo (JP); Ryoji Asakura, Tokyo (JP); Masahiro Sumiya, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 18/026,079

(22) PCT Filed: Mar. 23, 2022

(86) PCT No.: PCT/JP2022/013658
§ 371 (c)(1),
(2) Date: Mar. 13, 2023

(87) PCT Pub. No.: WO2023/181208
PCT Pub. Date: Sep. 28, 2023

(65) Prior Publication Data
US 2025/0014923 A1      Jan. 9, 2025

(51) Int. Cl.
*G01L 15/00*          (2006.01)
*H01L 21/67*          (2006.01)
(52) U.S. Cl.
CPC ........ *H01L 21/67253* (2013.01); *G01L 15/00* (2013.01)
(58) Field of Classification Search
CPC ......... H01L 21/67253; H01L 21/67288; H01L 21/02; H01L 21/67017; G01L 15/00
See application file for complete search history.

(56) References Cited

U.S. PATENT DOCUMENTS 6,716,477 B1 *   4/2004   Komiyama ............. C23C 16/52
                                                            427/8
7,751,921 B2 *   7/2010   Sakamoto ............... C23C 16/52
                                                            702/182
(Continued)

FOREIGN PATENT DOCUMENTS

JP          2008-072030 A2      3/2008
JP          2010-027836 A       2/2010
JP          2021-012654 A       2/2021

OTHER PUBLICATIONS

Search Report mailed Jun. 28, 2022 in International Application No. PCT/JP2022/013658.

*Primary Examiner* — Freddie Kirkland, III
(74) *Attorney, Agent, or Firm* — Miles & Stockbridge, P.C.

(57) ABSTRACT

An object of the present disclosure is to provide a diagnostic technique capable of determining an anomaly of an exhaust device or an exhaust pipe of a semiconductor manufacturing apparatus while suppressing variations due to processing conditions. In a diagnostic device for diagnosing a state of a semiconductor manufacturing apparatus including: a processing chamber in which a sample is processed; a transfer chamber that is connected to the processing chamber and transfers the sample to the processing chamber; a valve that is disposed between the processing chamber and the transfer chamber; and an exhaust device for exhausting the processing chamber, wherein whether or not there is an anomaly in the exhaust device or an exhaust pipe regarding the exhaust device is determined on the basis of a pressure regarding the exhaust device after the valve is opened.

7 Claims, 11 Drawing Sheets

(56) References Cited

U.S. PATENT DOCUMENTS

| | | | |
|---|---|---|---|
| 11,133,204 B2 * | 9/2021 | Hao ................. | G05B 19/41875 |
| 2004/0175849 A1 * | 9/2004 | Tanaka ............. | H01J 37/32972 |
| | | | 438/689 |
| 2007/0079758 A1 * | 4/2007 | Holland ............. | F04D 27/0253 |
| | | | 422/112 |
| 2008/0067146 A1 | 3/2008 | Onishi et al. | |
| 2020/0243359 A1 * | 7/2020 | Hao ................. | H01J 37/32935 |
| 2021/0011468 A1 | 1/2021 | Terasawa et al. | |

* cited by examiner

304 DED

| Date | Time | VALOJ | PE | PT |
|---|---|---|---|---|
| 2022/10/1 | 0:00:01 | Close | 0.30 | 1.0 |
| 2022/10/1 | 0:00:02 | Open | 0.44 | 0.9 |
| 2022/10/1 | 0:00:03 | Open | 0.50 | 0.85 |
| ... | ... | ... | ... | ... |

307 DTH

| PETH | PTTH |
|---|---|
| 0.95 | 0.83 |

308 DCC

| PE | PT |
|---|---|
| 0.55 | 0.93 |
| 0.56 | 0.92 |
| 0.54 | 0.91 |
| ... | ... |

FIG. 7

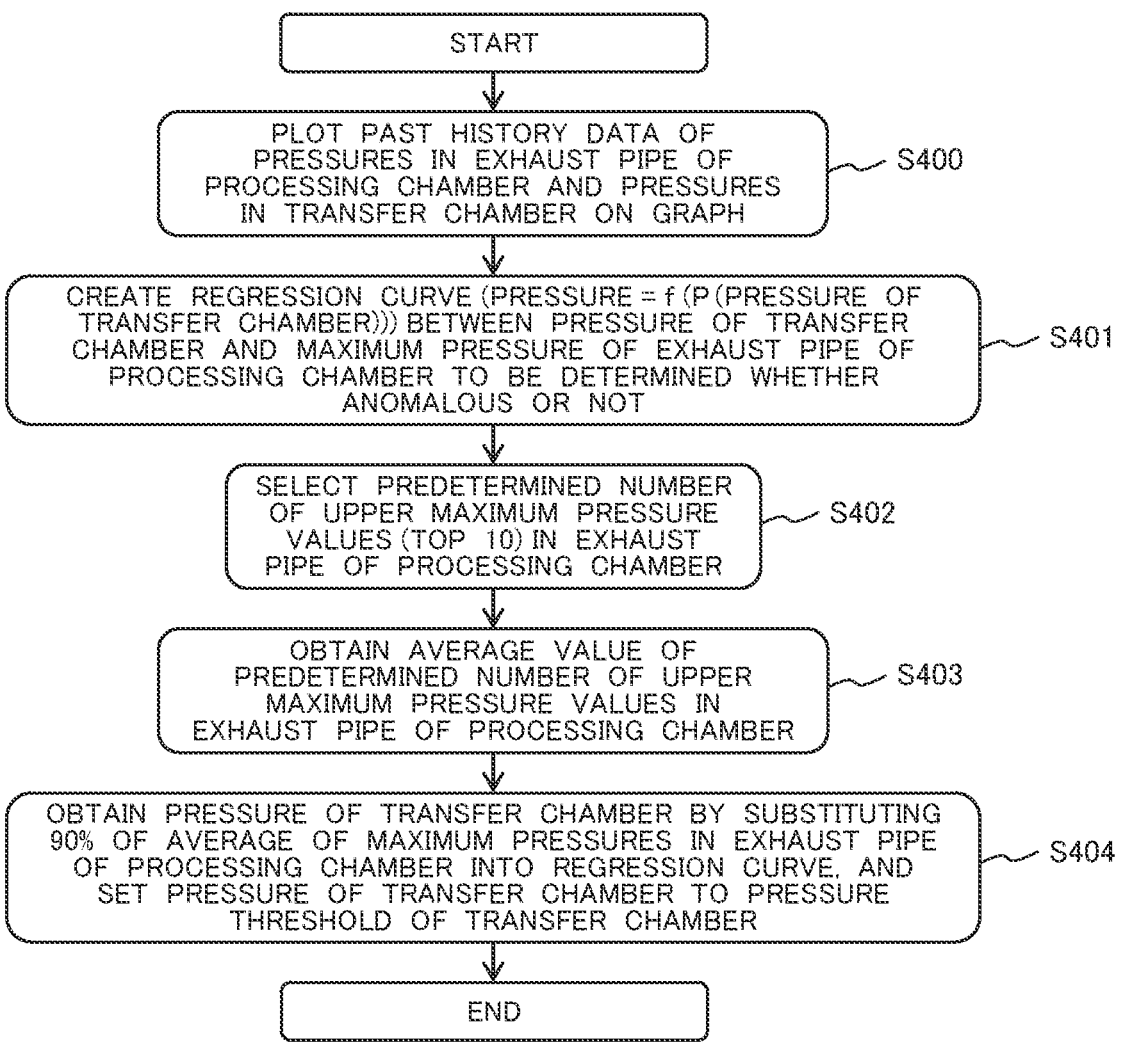

START

PLOT PAST HISTORY DATA OF PRESSURES IN EXHAUST PIPE OF PROCESSING CHAMBER AND PRESSURES IN TRANSFER CHAMBER ON GRAPH — S400

CREATE REGRESSION CURVE (PRESSURE = f (P(PRESSURE OF TRANSFER CHAMBER))) BETWEEN PRESSURE OF TRANSFER CHAMBER AND MAXIMUM PRESSURE OF EXHAUST PIPE OF PROCESSING CHAMBER TO BE DETERMINED WHETHER ANOMALOUS OR NOT — S401

SELECT PREDETERMINED NUMBER OF UPPER MAXIMUM PRESSURE VALUES (TOP 10) IN EXHAUST PIPE OF PROCESSING CHAMBER — S402

OBTAIN AVERAGE VALUE OF PREDETERMINED NUMBER OF UPPER MAXIMUM PRESSURE VALUES IN EXHAUST PIPE OF PROCESSING CHAMBER — S403

OBTAIN PRESSURE OF TRANSFER CHAMBER BY SUBSTITUTING 90% OF AVERAGE OF MAXIMUM PRESSURES IN EXHAUST PIPE OF PROCESSING CHAMBER INTO REGRESSION CURVE, AND SET PRESSURE OF TRANSFER CHAMBER TO PRESSURE THRESHOLD OF TRANSFER CHAMBER — S404

END

DIAGNOSTIC DEVICE, SEMICONDUCTOR MANUFACTURING EQUIPMENT SYSTEM, SEMICONDUCTOR EQUIPMENT MANUFACTURING SYSTEM, AND DIAGNOSTIC METHOD

TECHNICAL FIELD

The present disclosure relates to a diagnostic device, a semiconductor manufacturing equipment system, a semiconductor equipment manufacturing system, and a diagnostic method, and in particular, relates to a technology effective when applied to a diagnostic device and a diagnostic method for detecting the anomalies of a semiconductor manufacturing apparatus that manufactures semiconductor devices.

BACKGROUND ART

In a semiconductor manufacturing apparatus, the performances of a processing chamber and peripheral devices included in the semiconductor manufacturing apparatus may change due to aging factors or foreign matters may adhere to the apparatus. These may cause the operation of a semiconductor device to stop or cause defects in a semiconductor device formed on a semiconductor wafer.

As a method for detecting an anomaly of a semiconductor manufacturing apparatus using sensor data of the semiconductor manufacturing apparatus, Japanese Patent Application Laid-Open No. 2021-12654 is proposed, for example.

CITATION LIST

Patent Literature

PTL 1: Japanese Patent Application Laid-Open No. 2021-12654

SUMMARY OF INVENTION

Technical Problem

Japanese Patent Application Laid-Open No. 2021-12654 discloses a method of detecting an anomaly by calculating differences between target values and data using sensor data (pressure data, temperature data, and the like) obtained during processing performed by a semiconductor manufacturing apparatus. However, these sensor data pieces have different values depending on processing conditions. Therefore, if a single threshold is set for determining an anomaly, false information or oversights may occur depending on processing conditions.

An object of the present disclosure is to provide a diagnostic technique capable of determining an anomaly of an exhaust device or an exhaust pipe of a semiconductor manufacturing apparatus while suppressing variations due to processing conditions.

Other problems and novel features will become apparent from the description of the specification and the accompanying drawings.

Solution to Problem

A brief outline of a representative one of the present disclosure is as follows.

In a diagnostic device for diagnosing a state of a semiconductor manufacturing apparatus including: a processing chamber in which a sample is processed; a transfer chamber that is connected to the processing chamber and transfers the sample to the processing chamber; a valve that is disposed between the processing chamber and the transfer chamber; and an exhaust device for exhausting the processing chamber, whether or not there is an anomaly in the exhaust device or an exhaust pipe regarding the exhaust device is determined on the basis of pressure regarding the exhaust device after the valve is opened.

Advantageous Effects of Invention

According to the diagnostic device, it is possible to determine an anomaly of the exhaust device or the exhaust pipe of the semiconductor manufacturing apparatus while variations due to processing conditions are being suppressed. As a result, it is possible to reduce a false report and an oversight caused by the processing conditions.

BRIEF DESCRIPTION OF DRAWINGS

FIG. 4 is a diagram for explaining a data configuration example of device data, threshold data, and correlation calculation data shown in FIG. 3.

FIG. 7 is a processing flowchart for determining the pressure threshold of an exhaust pipe and the pressure threshold of a transfer chamber according to the example.

DESCRIPTION OF EMBODIMENTS

Hereinafter, an example will be explained with reference to the accompanying drawings. Here, in the following descriptions, the same components are given the same reference signs, and redundant explanations about the same components will be omitted in some cases. Furthermore, there are some cases where, in order to make the descriptions easier to understand, the accompanying drawings are schematically depicted differently from what the example really is, but these depictions of the drawings are only examples, so that the interpretation of the present invention is not limited to these depictions.

Example

Figure 1:
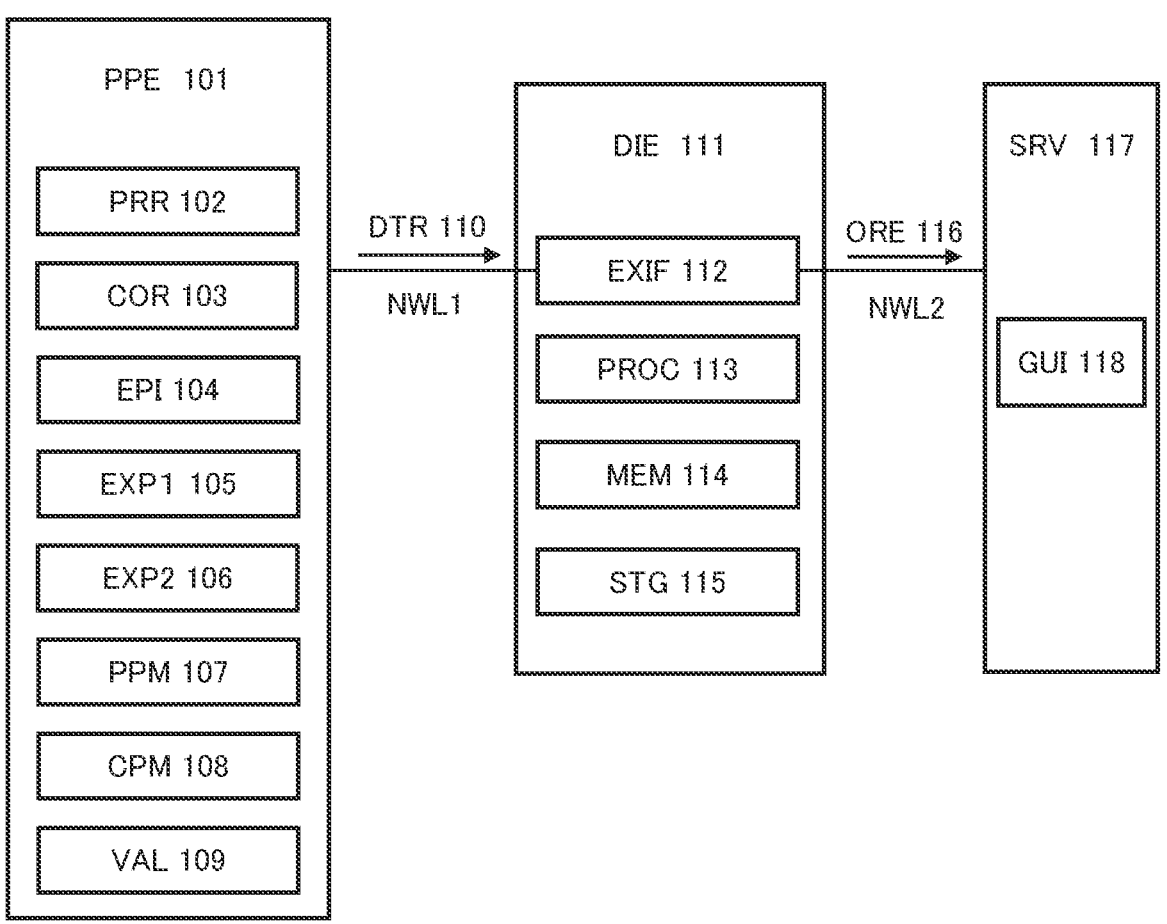
FIG. 1 is a hardware configuration diagram of a semiconductor manufacturing equipment system according to an example.
Figure 2:
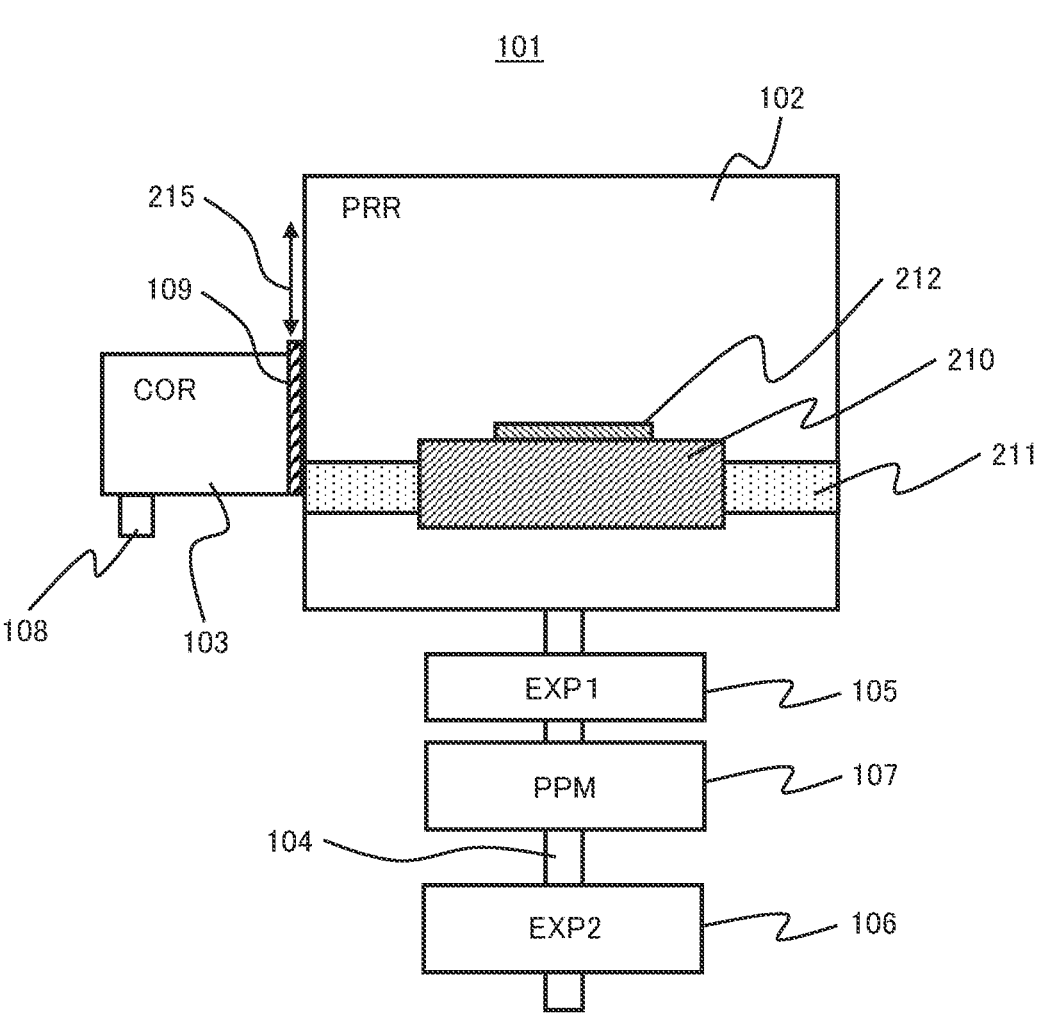
FIG. 2 is a hardware configuration diagram of a processing apparatus shown in FIG. 1.
Figure 3:
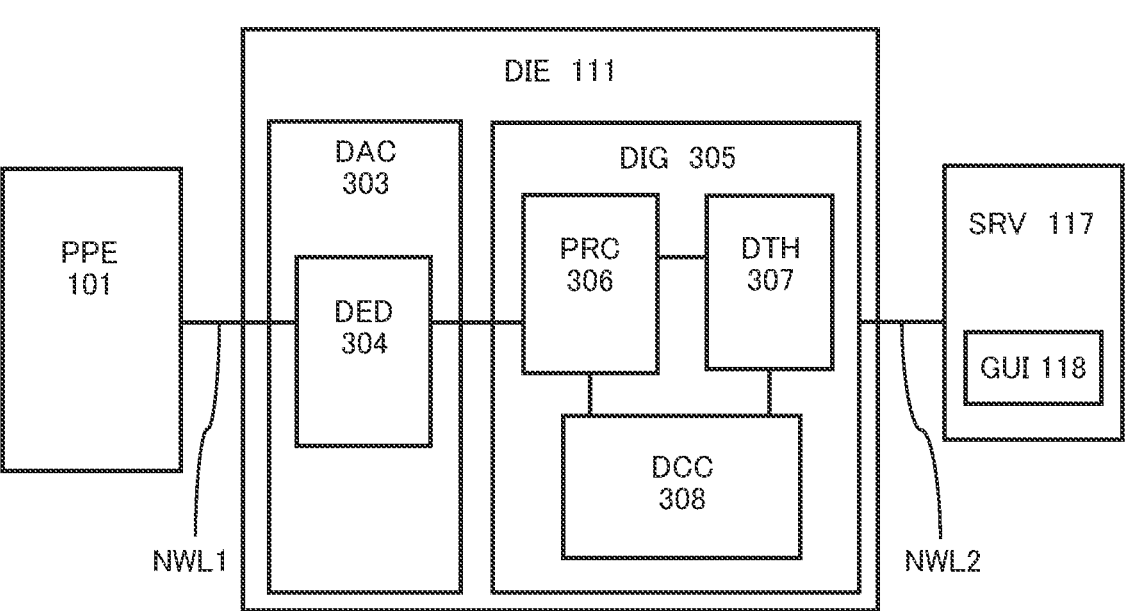
FIG. 3 is an explanatory diagram of functional blocks of a diagnostic device shown in FIG. 1.

FIG. 1 is a hardware configuration diagram of a semi-conductor manufacturing equipment system according to an example. FIG. 2 is a hardware configuration diagram of a processing apparatus shown in FIG. 1. FIG. 3 is an explanatory diagram of functional blocks of a diagnostic device shown in FIG. 1. FIG. 4 is a diagram for explaining a data configuration example of device data, threshold data, and correlation calculation data shown in FIG. 3.

As shown in FIG. 1, a semiconductor manufacturing equipment system 100 includes a processing apparatus (PPE) 101, a diagnostic device (DIE) 111, and a server (SRV) 117. The processing apparatus (PPE) 101 is a semiconductor manufacturing apparatus used for manufacturing semiconductor devices, and is, for example, a plasma processing apparatus such as a plasma etching apparatus. The semiconductor manufacturing equipment system 100 can also be called a semiconductor equipment manufacturing system. In the following descriptions, the processing apparatus (PPE) 101 is also called a semiconductor manufacturing apparatus 101.

The processing apparatus 101 and the diagnostic device 111 are connected by a first network line NWL1 for transmitting and receiving signals used by a LAN wiring (LAN cable), a USB wiring (USB cable), a wireless LAN, or the like. In addition, the diagnostic device 111 and the server 117 are connected by a second network line NWL2 for transmitting and receiving signals used by a LAN wiring (LAN cable), a USB wiring (USB cable), a wireless LAN or the like.

The processing apparatus 101 includes a processing chamber (PRR) 102, a transfer chamber (COR) 103, an exhaust pipe (EPI) 104, a first exhaust device (EXP1) 105, a second exhaust device (EXP2) 106, and a first pressure gauge (PPM) 107 for monitoring a pressure of the exhaust pipe 104, a second pressure gauge (CPM) 108 for monitoring a pressure of the transfer chamber 103, and a valve (VAL) 109.

The diagnostic device 111 is composed of a computer such as a personal computer or the like, and includes: an external interface circuit (EXIF) 112; a processor (PROC) 113; a memory (MEM) 114; and a storage (STG) 115 in this example. The memory 114 is composed of, for example, a semiconductor memory such as a RAM (Random Access Memory) capable of high-speed reading or writing. The storage 115 is configured by, for example, a large-capacity storage device such as an HDD (Hard Disk Drive) or an SSD (Solid State Drive).

The external interface circuit 112 is electrically connected to the processing apparatus 101 via the network line NWL1 in this example. Also, the external interface circuit 112 is electrically connected to the server 117 via the network line NWL2 in this example.

The diagnostic device 111 receives signal data (sensor data) of various sensors installed in the processing apparatus 101 from the external interface circuit 112 via the network line NWL1, for example, using data transfer (DTR) 110. The diagnostic device 111 transmits, for example, an output result (ORE) 116 such as diagnostic results from the external interface circuit 112 to the server 117 via the network line NWL2.

The server 117 includes a display division for displaying the output result 116 using a GUI 118.

As shown in FIG. 2, the processing apparatus (PPE) 101, which is a semiconductor manufacturing apparatus, includes: the processing chamber 102 in which a sample 212 is processed; the transfer chamber 103 that is connected to the processing chamber 102 and transfers the sample 212 to the processing chamber 102; and the valve 109 that is disposed between the processing chamber 102 and the transfer chamber 103. Furthermore, the processing apparatus 101 includes: the exhaust pipe 104 connected to the processing chamber 102; the first exhaust device 105 and the second exhaust device 106 both of which are provided in the exhaust pipe 104 and exhaust the processing chamber 102; the first pressure gauge 107 for measuring (monitoring) a pressure of the exhaust pipe 104; and the second pressure gauge 108 for measuring (monitoring) a pressure of the transfer chamber 103.

The processing chamber 102 includes a wafer stage 210 that is a sample stage on which a sample 212 is mounted, and a stage base 211 that supports the wafer stage 210. The sample 212 is mounted on the wafer stage 210, the inside of the processing chamber 102 is brought into a predetermined state (pressure, gas, and the like), and desired processing is performed on the sample 212. The desired processing includes, for example, film formation processing, etching processing, ion implantation processing, oxidation processing, and the like.

The transfer chamber 103 is a temporary waiting place for the sample 212, and temporarily stores the sample 212 when the sample 212 is carried into the processing chamber 102 and when the sample 212 is carried out from the processing chamber 102. When the desired processing is performed on the sample 212, the sample 212 is carried (transferred) from the transfer chamber 103 into the processing chamber 102. When the sample 212 is carried into the processing chamber 102, the valve 109 for cutting off the communication between the processing chamber 102 and the transfer chamber 103 is opened, so that the processing chamber 102 and the transfer chamber 103 communicate with each other. Next, the sample 212 disposed in the transfer chamber 103 is mounted on the wafer stage 210. After that, the valve 109 is closed to cut off the communication between the processing chamber 102 and the transfer chamber 103, and the processing chamber 102 is sealed. Then, the inside of the processing chamber 102 is brought into the desired state, and the desired processing is performed on the sample 212. On the other hand, after the desired processing is performed on the sample 212, the sample 212 is carried out from the processing chamber 102. When the sample 212 is carried out (transferred) from the processing chamber 102 to the transfer chamber 103, the valve 109 is opened and the processing chamber 102 and the transfer chamber 103 communicate with each other. Then, the sample 212 mounted on the wafer stage 210 is carried out to the transfer chamber 103. After that, the valve 109 is closed to cut off the communication between the processing chamber 102 and the transfer chamber 103. In FIG. 2, the opening and closing direction of the valve 109 is schematically shown by an arrow 215, the upward movement of the valve 109 indicates opening of the valve 109, and the downward movement of the valve 109 indicates closing of the valve 109. A state in which the valve 109 is open indicates a case where the sample 212 is transferred from the transfer chamber 103 to the processing chamber 102 or a case where the sample 212 is transferred from the processing chamber 102 to the transfer chamber 103.

The first exhaust device 105 is, for example, a vacuum pump such as a turbomolecular pump. The second exhaust device 106 is, for example, a vacuum pump such as a dry pump. The processing chamber 102 connected to the exhaust pipe 104 is roughly exhausted to a predetermined degree of vacuum by the second exhaust device 106 and then high-precisely exhausted to a predetermined high degree of vacuum by the first exhaust device 105. The high vacuum has, for example, a degree of vacuum that allows the generation of a plasma.

The first pressure gauge 107 is connected to the exhaust pipe 104 and can measure (monitor) the pressure of the exhaust pipe 104. Thereby, the pressure of the processing chamber 102 connected to the exhaust pipe 104 can be measured (monitored). A pressure value (pressure value of the exhaust pipe 104) measured by the first pressure gauge 107 is data-transferred 110 to the diagnostic device 111.

The second pressure gauge 108 is connected to the transfer chamber 103 and can measure (monitor) the pressure of the transfer chamber 103. A pressure value (pressure value of the transfer pipe 103) measured by the second pressure gauge 108 is data-transferred 110 to the diagnostic device 111.

As shown in FIG. 3, the diagnostic device 111 configured by a computer is materialized by the processor 113 executing, for example, a software program (also called an application program) that substantializes the functions of the diagnostic device 111 stored in the storage 115. The diagnostic device 111 includes the data collection division (DAC) 303 and a diagnostic division (DIG) 305. In the diagnostic device 111, each function (303 or 305) may be configured with a hardware circuit.

The data collection division (DAC) 303 has a function for receiving data of pressure values (the pressure value PE of the exhaust pipe 104 (the pressure value of the processing chamber 102) and the pressure value PT of the transfer chamber 103) transmitted by the data transfer 110, and saving the data of pressure values in the storage 115 as device data (DED) 304.

The diagnosis division (DIG) 305 includes a processing division (PRC) 306, threshold data (DTH) 307, and correlation calculation data (DCC) 308. The processing division (PRC) 306 is materialized by the processor 113 executing a software program. The threshold data (DTH) 307 and the correlation calculation data (DCC) 308 are stored in the storage 115.

The correlation calculation data (DCC) 308 is composed of past history data of the pressure values PE of the exhaust pipe 104 and the pressure values PT of the transfer chamber 103 during a predetermined period after the valve 109 is opened. These past history data can be obtained from, for example, the device data (DED) 304. The predetermined period after the valve 109 is opened is not particularly limited, but can be, for example, a time range of 5 seconds to 10 seconds after the valve 109 is opened. Here, as an anomaly detection method, a method using the maximum value of pressure will be described below, but there is no problem even if other variables (parameters) are used. To put it concretely, statistic amounts of the current value of the first exhaust device 105 or the like can be cited candidates used for the anomaly detection.

The processing division (PRC) 306 plots (creates) a graph on the basis of the correlation calculation data (DCC) 308. And then, on the basis of the created graph, the processing division (PRC) 306 generates a regression curve representing the correlation between the pressure value of the transfer chamber 103 and the maximum pressure value of the exhaust pipe 104 (pressure value of the exhaust pipe 104=f(P (pressure value of the transfer chamber 103))). Then, the processing division (PRC) 306 selects a predetermined number of upper maximum pressure values of the exhaust pipe 104 (for example, the top 10 maximum pressure values), and calculates an average value (PEVA10) of the selected top 10 maximum pressure values. The processing division (PRC) 306 generates a threshold PETH of the pressure value PE of the exhaust pipe 104 on the basis of the average value (PEVA10) of the selected top 10 maximum pressure values. The threshold PETH can be, for example, a pressure value between 85% and 95% of the average value (PEVA10), and more preferably can be a pressure value of about 90% of the average value (PEVA10). The processing division (PRC) 306 also generates a threshold (also referred to as a predetermined value) PTTH of the pressure value of the transfer chamber 103 by substituting the threshold PETH into the regression curve (pressure value of the exhaust pipe 104=f(P (pressure value in the transfer chamber 103))). In other words, the predetermined value (threshold PTTH) is obtained on the basis of the regression curve representing the correlation between the maximum value of pressures regarding the exhaust devices (105 and 106) and the pressure value of the transfer chamber 103 during the predetermined period after the valve 109 is opened. The thresholds PETH and PTTH are stored in the storage 115 as the threshold data (DTH) 307. The thresholds PETH and PTTH will be explained in detail with reference to FIGS. 7 and 11 which will be described later.

FIG. 4 shows examples of the data configurations of the device data (DED) 304, the threshold data (DTH) 307 and the correlation calculation data (DCC) 308 shown in FIG. 3.

The device data (DED) 304 is time series data of the pressure value PE of the exhaust pipe 104 and the pressure value PT of the transfer chamber 103 measured by the first pressure gauge 107 and the second pressure gauge 108 respectively, and includes dates (in Colum Date), times (in Column Time), valve open determinations (in Colum VALOJ), the pressure values (in Colum PE) of the exhaust pipe 104, and the pressure values (in Colum PT) of the transfer chamber 103. The valve open determination (VALOJ) shows determination results of the open state (OPEN) and the close state (CLOSE) of the valve 109.

The threshold data (DTH) 307 includes the threshold PETH of the pressure value PE of the exhaust pipe 104 and the threshold PTTH of the pressure value PT of the transfer chamber 103.

The correlation calculation data (DCC) 308 includes multiple sets of pressure values PE of the exhaust pipe 104 and the pressure values PT of the transfer chamber 103.

The diagnostic device 111 is composed of a personal computer and includes a platform on which an application for detecting an anomaly in the exhaust systems (the first exhaust device 105 and the second exhaust device 106) or the exhaust pipe 104 of the semiconductor manufacturing apparatus 101 is installed. The diagnostic device 111 is connected to the semiconductor manufacturing apparatus 101 including: a processing chamber 102 for processing samples 212; the transfer chamber 103 connected to the processing chamber 102 for transferring the samples 212 to the processing chamber 102; the valve 109 for cutting off between the processing chamber 102 and the transfer chamber 103; the exhaust devices (105 and 106) and the exhaust pipe 104 all connected to the processing chamber 102; and the first pressure gauge 107 for measuring (monitoring) the pressure of the exhaust pipe 104. The diagnostic device 111 determines whether there is an anomaly in the exhaust device 105, the exhaust device 106, or the exhaust pipe 104 of the semiconductor manufacturing apparatus 101 using a pressure value measured by the pressure gauge 107 during the predetermined period after the valve 109 is opened. That is, the diagnostic device 111 determines whether there is an anomaly in the exhaust device 105, the exhaust device 106, or the exhaust pipe 104 regarding the exhaust devices (105 and 106) on the basis of the pressures regarding the exhaust devices (105 and 106) after the valve 109 is opened.

Hereinafter, an operation flow for determining whether there is an anomaly performed by the diagnostic device 111 according to the present disclosure will be described.

The diagnostic device 111 determines whether there is an anomaly in the exhaust device 105, the exhaust device 106, or the exhaust pipe 104 of the semiconductor manufacturing apparatus 101 using the pressure value of the exhaust pipe 104 during a predetermined period after the valve 109 is opened, for example, during a range of 5 seconds to 10 seconds. Since the pressure value of the exhaust pipe 104 during the predetermined period after the valve 109 is opened, it becomes unnecessary to consider fluctuations in the pressure value of the exhaust pipe 104 due to variations in processing conditions in the processing chamber 102. As a result, the fluctuations in the pressure value of the exhaust pipe 104 can be suppressed, and the presence or absence of an anomaly in the exhaust device 105, the exhaust device 106, or the exhaust pipe 104 of the semiconductor manufacturing apparatus 101 can be accurately determined.

Further, according to a finding by the present inventors, the pressure value PE of the exhaust pipe 104 and the pressure value PT of the transfer chamber 103, which are measured by the first pressure gauge 107 and the second pressure gauge 108 respectively, have a predetermined correlation. On the other hand, the pressure value of the exhaust pipe 104 measured by the first pressure gauge 107 may have variations (noises) even after the valve 109 is opened. Therefore, it has been found that it is preferable to introduce a threshold (PETH) used for determining the pressure value PE of the exhaust pipe 104 in order to eliminate the variations in the measured pressure value of the exhaust pipe 104. A similar finding is also found in the maximum value of the current value of the first exhaust device 105. In addition, as for the calculation of the threshold (PETH), descriptions about FIG. 7 and FIG. 11 that will be explained later can be referred to.

The diagnostic device 111 determines that the exhaust devices 105, 106, or the exhaust pipe 104 of the semiconductor manufacturing apparatus 101 is anomalous if the pressure value of the second pressure gauge 108 exceeds the threshold PTTH that is a predetermined threshold (predetermined value) (if the pressure value of the second pressure gauge 108>PTTH) during a predetermined period after the valve 109 is opened. That is, when the pressure of the transfer chamber 103 after the valve 109 is opened exceeds the predetermined value, the diagnostic device 111 determines whether there is an anomaly or not. As a result, the diagnostic device 111 can accurately determine whether or not there is an anomaly in the exhaust devices 105, 106, or the exhaust pipe 104, while suppressing the variations in the pressure value of the exhaust pipe 104 due to the processing conditions of the semiconductor manufacturing apparatus 101 for a sample, and the variations (noises) in the measured pressure value of the exhaust pipe 104 during the predetermined period after the valve 109 is opened.

Although the configuration example of the semiconductor manufacturing equipment system 100 provided with the diagnostic device 111 connected to the semiconductor manufacturing device 101 via a network has been described above, the diagnostic device 111 is not limited to this configuration example. The semiconductor manufacturing equipment system 100 may be configured by realizing the diagnostic device 111 by software executed by the server SRV, for example, and connecting the server SRV to the semiconductor manufacturing apparatus 101 via a network.

Figure 5:
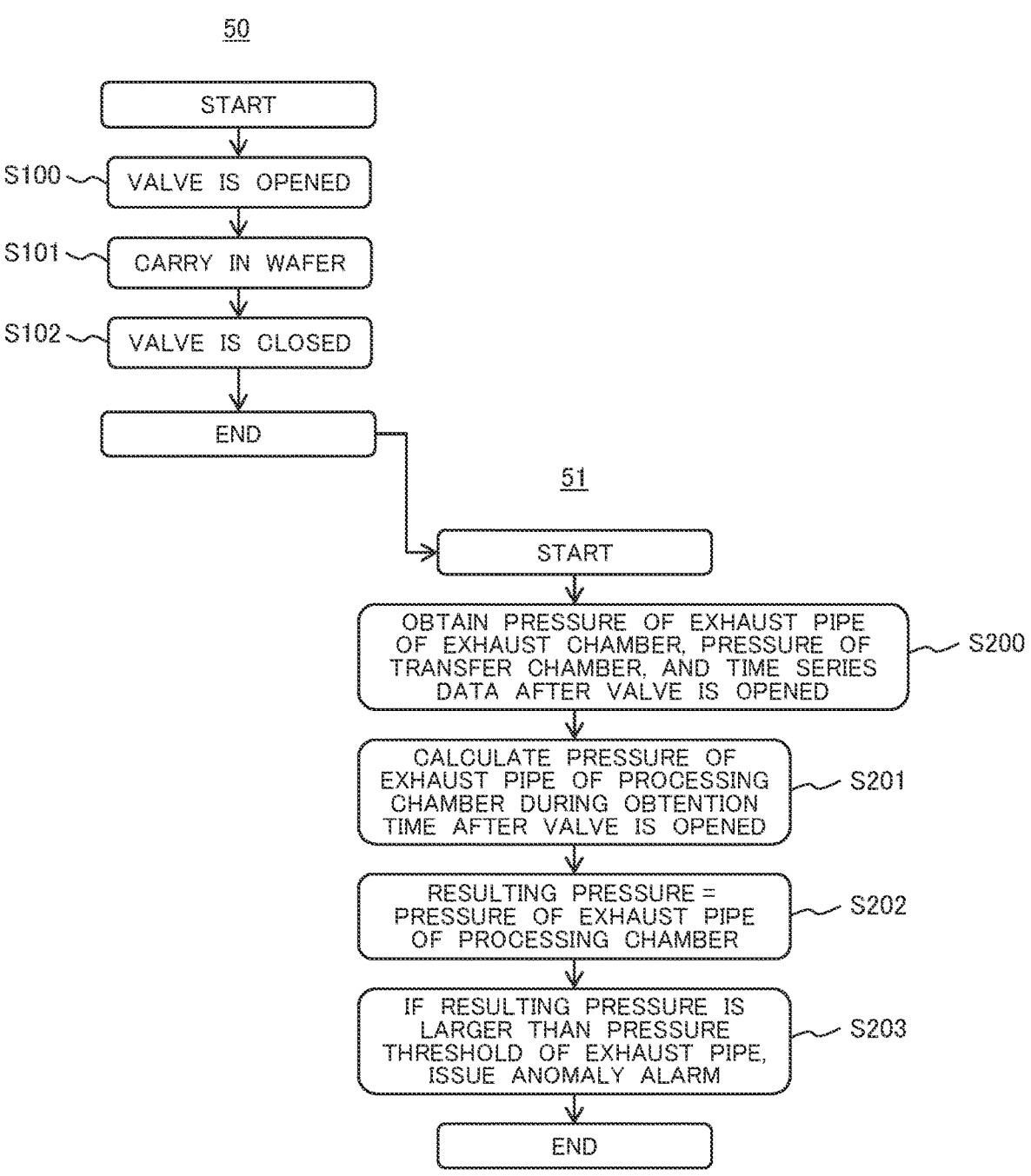
FIG. 5 is a processing flowchart of the diagnostic device according to the example.

Next, with reference to FIG. 5, an anomaly diagnosis flow according to a diagnosis algorithm executed by the diagnostic device 111 will be described. FIG. 5 is a processing flowchart of the diagnostic device according to the example. A processing flow according to this diagnostic method shows the anomaly diagnosis flow according to the diagnosis algorithm. FIG. 5 shows the diagnostic method including an operation flow 50 of the semiconductor manufacturing apparatus 101 and an operation flow 51 of anomaly diagnosis of the diagnostic device 111.

First, the operation flow 50 of the semiconductor manufacturing apparatus 101 will be explained.

The operation flow 50 of the semiconductor manufacturing apparatus 101 includes Step S100, Step S101, and Step S103.

Step S100: The state of the valve 109 is changed from the closed state (Close) to the open state (Open).

Step S101: A wafer, which is a sample 212 before being processed, is carried from the transfer chamber 103 into the inside of the processing chamber 102 while the valve 109 is open. Or a wafer, which is a sample 212 after being processed, is carried out from the processing chamber 102 to the inside of the transfer chamber 103.

Step S102: The state of the valve 109 is changed from the open state (Open) to the closed state (Close). In addition, in steps S100 to S102, the first pressure gauge 107 and the second pressure gauge 108 measure the pressure value PE of the exhaust pipe 104 and the pressure value PT of the transfer chamber 103 respectively, and the measured pressure values are data-transferred 110 to the data collection division (DAC) 303 of the diagnostic device 111, and time-series data are stored in the device data (DED) 304.

Figure 8:
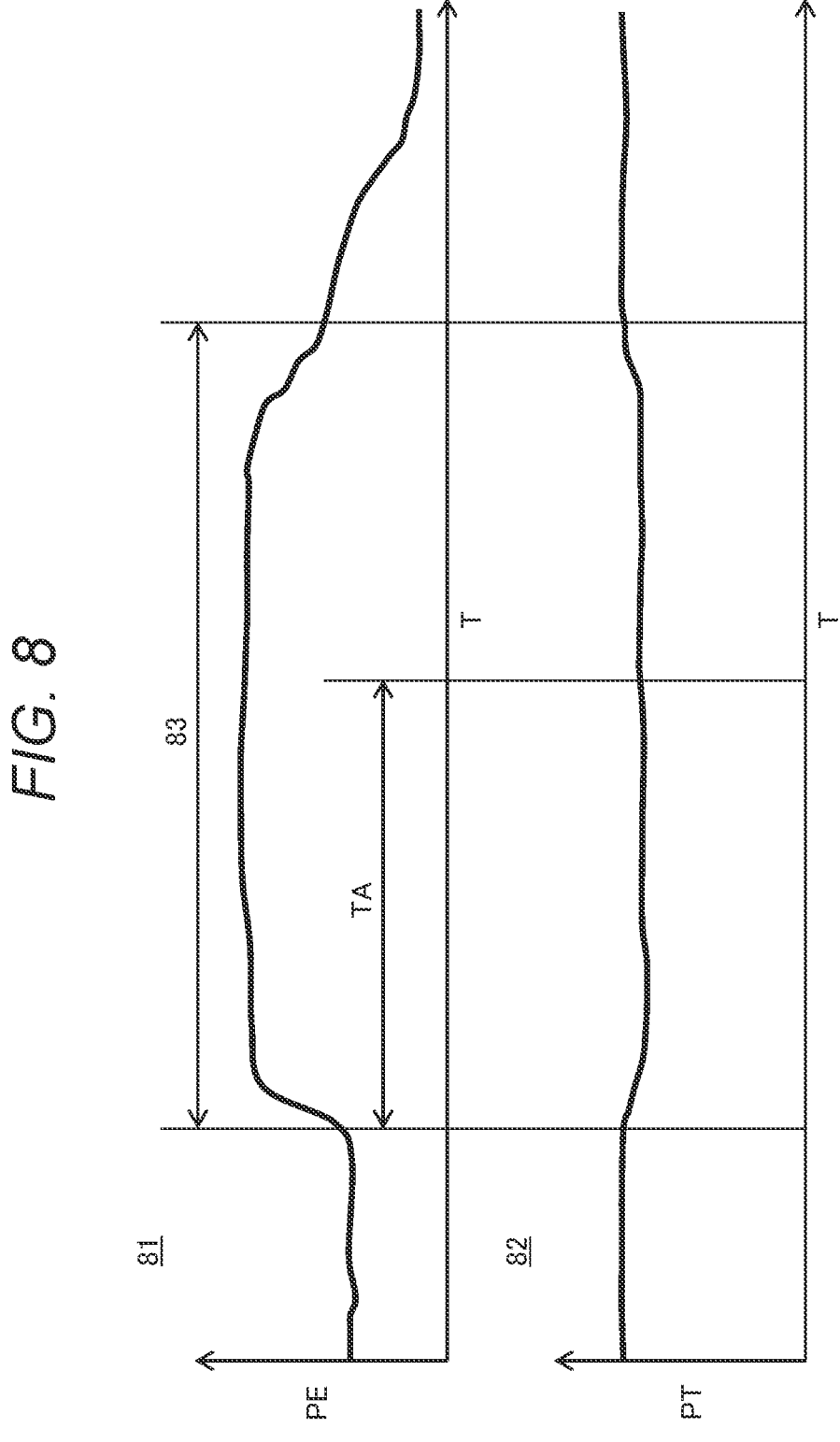
FIG. 8 is an explanatory diagram of configuration examples of a pressure of the exhaust pipe and a pressure of the transfer chamber of a semiconductor manufacturing apparatus according to the example.

FIG. 8 is an explanatory diagram of configuration examples of the pressure value PE in the exhaust pipe 104 and the pressure value PT in the transfer chamber 103 of the semiconductor manufacturing apparatus 101 according to the example. In FIG. 8, the horizontal axis of a graph 81 represents time T, and the vertical axis represents the pressure value PE of the exhaust pipe 104 measured by the first pressure gauge 107. In a graph 82, the horizontal axis represents time T, and the vertical axis represents the pressure value PT of the transfer chamber 103 measured by the second pressure gauge 108. 83 represents a period during which the valve 109 is opened (Open). TA represents a predetermined period after the valve 109 is made in an open state (Open). The predetermined period TA ranges, for example, from 5 seconds to 10 seconds. Using the pressure value PE of the exhaust pipe 104 during the predetermined period TA after the valve 109 is made in the open state (Open), the presence or absence of an anomaly in the exhaust device 105, the exhaust device 106, or the exhaust pipe 104 of the semiconductor manufacturing apparatus 101 is determined.

As shown in FIG. 5, the operation flow 51 of the diagnostic device 111 includes Step S200, Step S202, and Step S203.

Step S200: The processing division 306 of the diagnostic device 111 obtains time-series data (refer to FIG. 8) after the valve 109 is made in the open state about the pressure value PE of the exhaust pipe 104 of the processing chamber 102 and the pressure value PT of the transfer chamber 103 from the data collection division (DAC) 303.

Step S201: The processing division 306 of the diagnostic device 111 uses the obtained time-series data to calculate the pressure value PE of the exhaust pipe 104 of the processing chamber 102 during the predetermined period TA after the valve 109 is made in the open state (Open).

Step S202: The processing division 306 substitutes the pressure value PE of the exhaust pipe 104 calculated in step S201 into a resulting pressure.

Step S203: If the resulting pressure is larger than the threshold PETH of the pressure value PE of the exhaust pipe 104 (pressure value PE>PETH in the exhaust pipe 104), the processing division 306 issues an anomaly alarm. On the other hand, if the resulting pressure is not larger than the threshold PETH (pressure value PE of the exhaust pipe 104<PETH), the anomaly diagnosis operation flow is terminated without issuing the anomaly alarm. Here, regarding the threshold PETH of the pressure value PE of the exhaust pipe 104, the description of FIG. 7 and FIG. 11, which will be described later, can be referred to.

That is, Step S200 to Step S203 for determining whether or not there is an anomaly in the exhaust device 105, the exhaust device 106, or the exhaust pipe 104 regarding the exhaust devices (105 and 106) on the basis of the pressures regarding the exhaust devices (105 and 106) after the valve 109 is opened are executed by the application for diagnosing the state of the semiconductor manufacturing apparatus 101.

Figure 9:
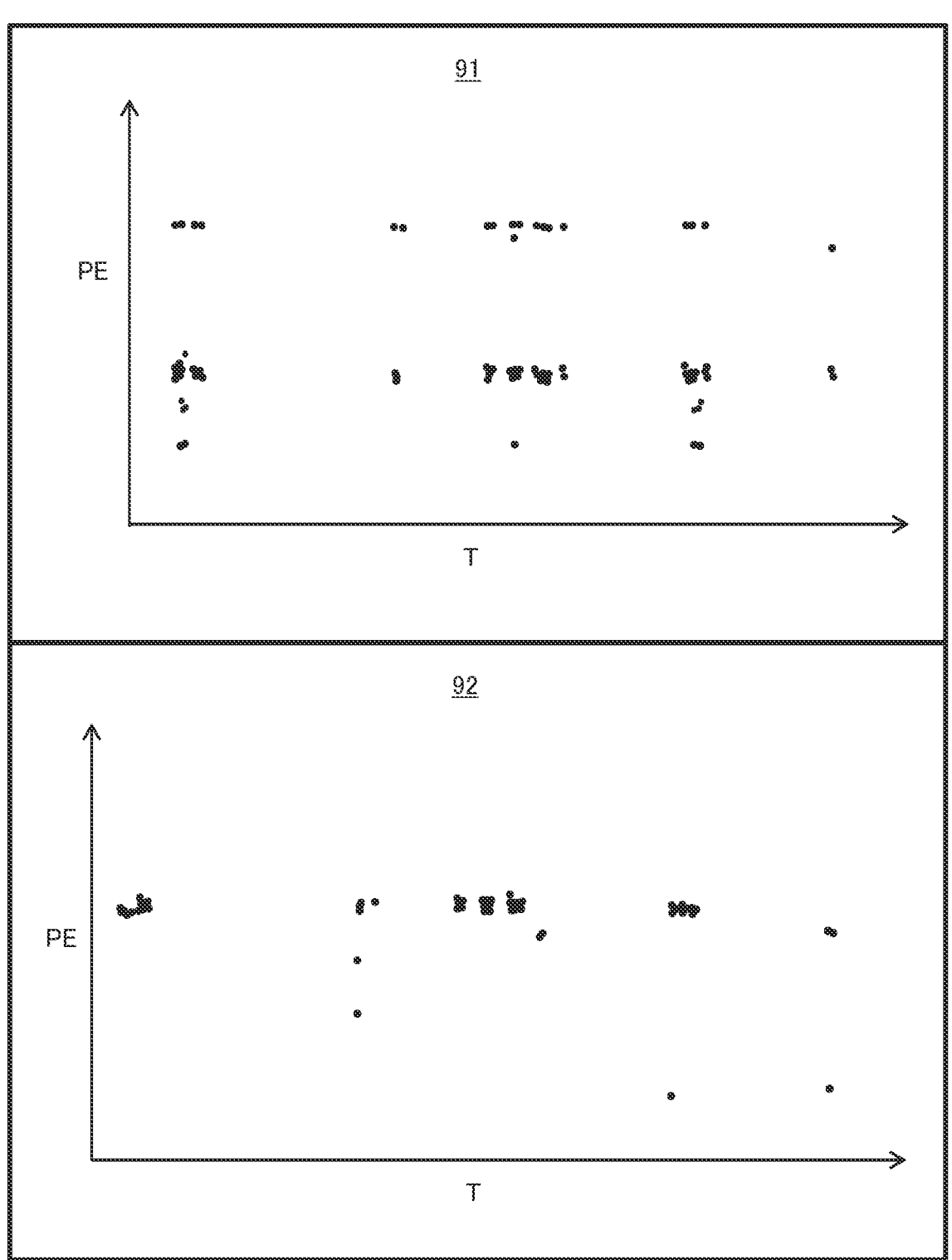
FIG. 9 is an explanatory diagram of the pressure of the exhaust pipe (during processing and after opening a valve).

FIG. 9 is an explanatory diagram of the pressure PE of the exhaust pipe 104 (during processing and after opening the valve). In FIG. 9, a graph 91 is an example of the pressure value PE of the exhaust pipe 104 while the sample 212 is being processed in the processing chamber 102, where the horizontal axis represents time T, and the vertical axis represents the pressure value PE of the exhaust pipe 104. A graph 92 is an example of the pressure value PE of the exhaust pipe 104 during the predetermined period TA after the valve 109 is made in the open state (Open), where the horizontal axis represents time T, and the vertical axis represents the pressure PE of the exhaust pipe 104.

From the graph 91, it can be seen that while the sample 212 is being processed in the processing chamber 102, the pressure value PE of the exhaust pipe 104 fluctuates depending on the processing conditions such that it sometimes becomes a high pressure value and sometimes becomes a low pressure value.

On the other hand, as shown in the graph 92, it can be seen that the variations in the pressure value PE of the exhaust pipe 104 during the predetermined period TA after the valve 109 is made in the open state (Open) are more suppressed when being compared with the variations in the pressure value PE of exhaust pipe 104 shown in the graph 91. That is, when an anomaly of the exhaust devices 105, 106 or the exhaust pipe 104 of the semiconductor manufacturing apparatus 101 is detected, the anomaly in the exhaust devices 105, 106 or the exhaust pipe 104 of the semiconductor manufacturing apparatus 101 can be detected while the variations in the pressure value PE due to the processing conditions are being suppressed by detecting the anomaly on the basis of the pressure value PE of the exhaust pipe 104 during the predetermined period TA after the valve 109 is made in the open (Open).

In the graph 92, it can be seen that although the variations in the pressure value PE due to the processing conditions are suppressed, a considerable number of variations (noises) occur in part of the pressure value PE. Therefore, it is preferable that, after the threshold PETH of the pressure value PE of the exhaust pipe 104 is set, whether or not to issue an anomaly alarm for notifying the presence of an anomaly in the exhaust devices 105, 106, or the exhaust pipe 104 of the semiconductor manufacturing apparatus 101 is determined in consideration of whether or not the pressure value PE of the exhaust pipe 104 is larger than the threshold PETH. As a result, whether or not there is an anomaly in the exhaust devices 105, 106, or the exhaust pipe 104 of the semiconductor manufacturing apparatus 101 can be accurately determined, while suppressing the variations (noises) in the measured pressure value of the exhaust pipe 104 during the predetermined period after the valve 109 is opened.

Figure 6:
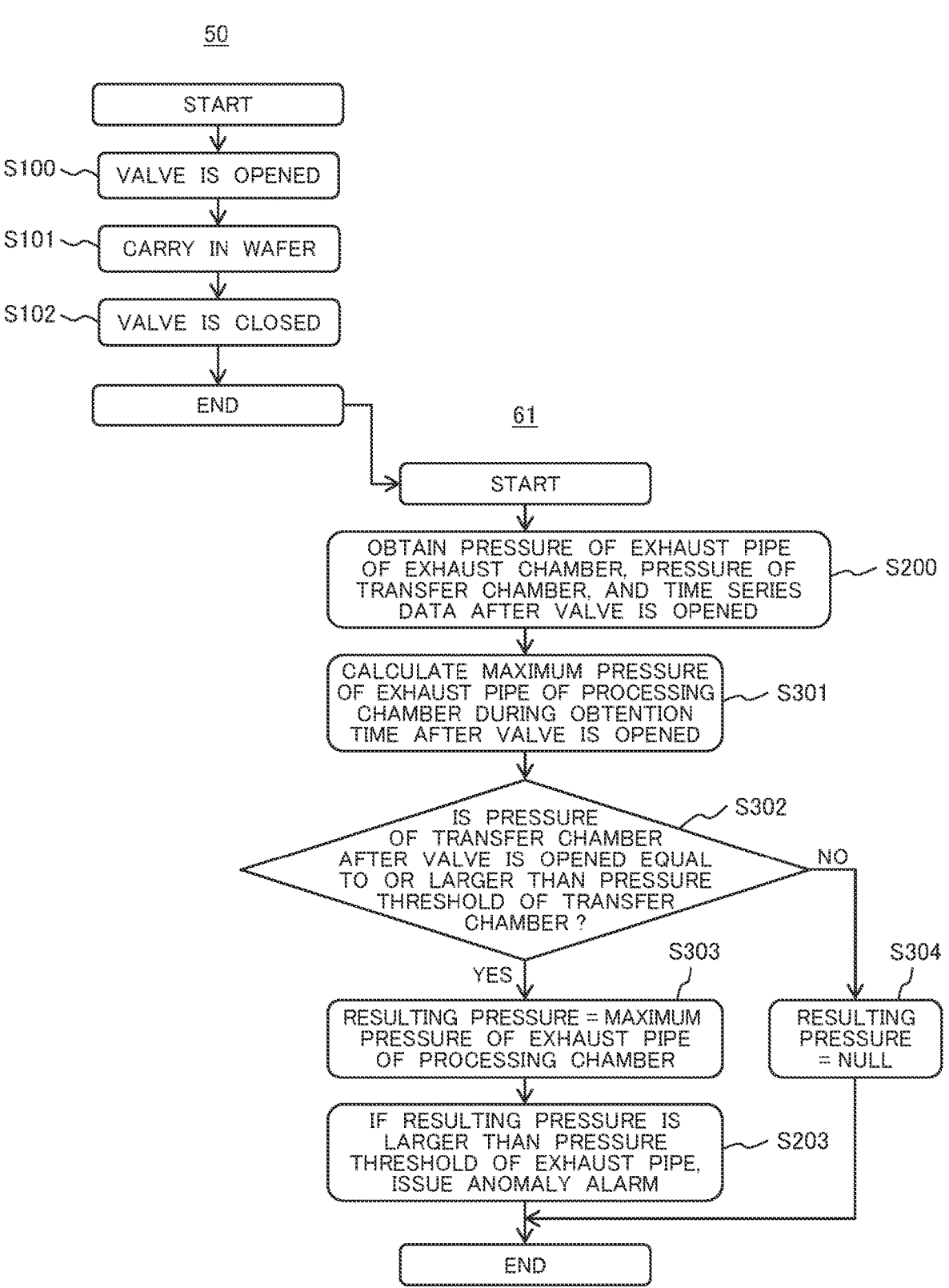
FIG. 6 is another processing flowchart of the diagnostic device according to the example.

Next, with reference to FIG. 6, another example of an anomaly diagnosis flow according to the diagnosis algorithm executed by the diagnostic device 111 will be described. FIG. 6 is another processing flowchart of the diagnostic device according to the example. This processing flow shows the anomaly diagnosis flow according to the diagnosis algorithm. FIG. 6 shows a diagnostic method including an operation flow 50 of the semiconductor manufacturing apparatus 101 and an operation flow 61 of the anomaly diagnosis of the diagnostic device 111.

Since an operation flow 50 of the semiconductor manufacturing apparatus 101 is the same as the operation flow 50 of the semiconductor manufacturing apparatus 101 shown in FIG. 5, redundant explanations will be omitted.

The operation flow 61 of the anomaly diagnosis of the diagnostic device 111 includes Step S200, Step S301, Step S302, Step 303, Step 304, and Step S203.

Step S200: The processing division 306 of the diagnostic device 111 obtains the time-series data (refer to FIG. 8) from the data collection division (DAC) 303 after the valve 109 is made in the open state (Open), where the time-series data is data about the pressure value PE of the exhaust pipe 104 of the processing chamber 102 and the pressure value PT of the transfer chamber 103.

Step S301: The processing division 306 of the diagnostic device 111 calculates (extracts) the maximum of the pressure value PE of the exhaust pipe 104 of the processing chamber 102 during the predetermined period TA after the valve 109 is made in the open state (Open) from the obtained time-series data.

Step S302: The processing division 306 of the diagnostic device 111 determines whether or not the pressure value PT of the transfer chamber 103 during the predetermined period TA after the valve 109 is made in the open state (Open) is equal to or larger than the threshold PTTH of the pressure value PT of the transfer chamber 103. If the pressure value PT of the transfer chamber 103 during the predetermined period TA is equal to or larger than the threshold PTTH (PT>PTTH) (Yes), the flow proceeds to Step S303. If the pressure value PT of the transfer chamber 103 during the predetermined period TA is not equal to nor larger than the threshold PTTH (PT>PTTH) (No), the flow proceeds to step S304.

Step S303: The processing division 306 substitutes the maximum pressure value of the exhaust pipe 104 calculated at Step S201 into the resulting pressure.

Step S304: The processing division 306 makes the resulting pressure null, and ends the operation flow of the anomaly diagnosis.

Step S203: If the resulting pressure is larger than the threshold PETH of the pressure value PE of the exhaust pipe 104 (pressure value PE of the exhaust pipe 104>PETH), the processing division 306 issues an anomaly alarm. On the other hand, if the resulting pressure is not larger than the threshold PETH (pressure value PE<PETH of the exhaust pipe 104), the anomaly diagnosis operation flow is terminated without issuing the anomaly alarm.

That is, Step S200, Step S301 to Step S304, and Step S203 of determining whether or not there is an anomaly in the exhaust device 105, the exhaust device 106, or the exhaust pipe 104 regarding the exhaust devices (105 and 106) on the basis of the pressures regarding the exhaust devices (105 and 106) after the valve 109 is opened are executed by the application for diagnosing the state of the semiconductor manufacturing apparatus 101.

Figure 10:
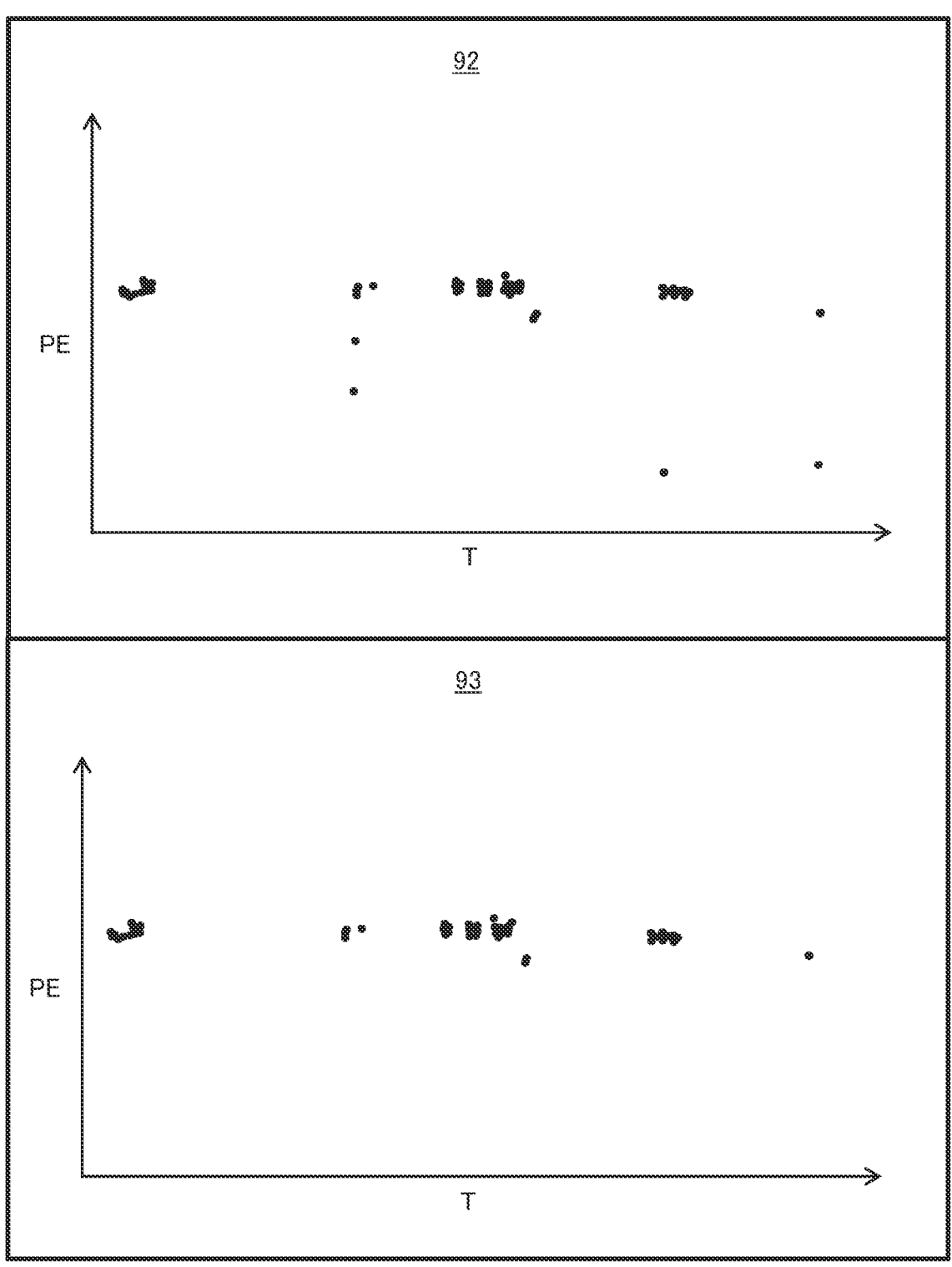
FIG. 10 is an explanatory diagram of the pressure of the transfer chamber (before applying the threshold and after applying the threshold).
Figure 11:
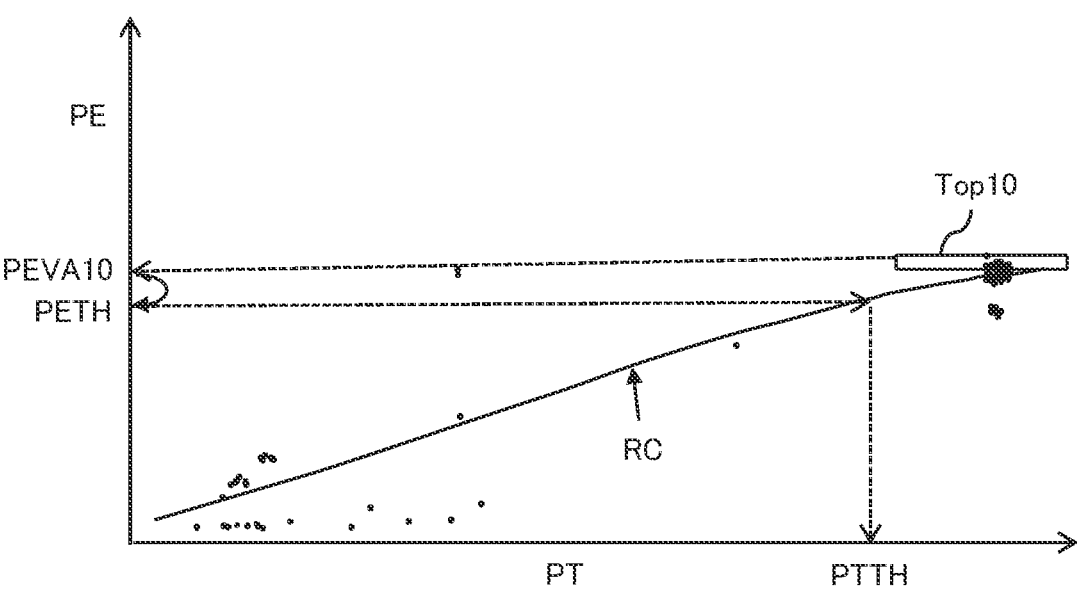
FIG. 11 is an explanatory diagram of an example of a step for determining the threshold of the pressure of the exhaust pipe and the threshold of the pressure of the transfer chamber from the pressure of the exhaust pipe and the pressure of the transfer chamber.

Next, the threshold PETH of the pressure value PE of the exhaust pipe 104 and the threshold PTTH of the pressure value PT of the transfer chamber 103 will be described with reference to FIG. 7, FIG. 10, and FIG. 11. FIG. 7 is a processing flowchart for determining the pressure threshold (PETH) of the exhaust pipe 104 and the pressure threshold (PTTH) of the transfer chamber 103 according to the example. FIG. 10 is an explanatory diagram of the pressure value PT of the transfer chamber 103 (before applying the threshold and after applying the threshold). FIG. 11 is an explanatory diagram of an example of a step for determining the threshold PETH of the pressure value PE of the exhaust pipe 104 and the threshold PTTH of the pressure value PT of the transfer chamber 103 from the correlation calculation data (DCC) between the pressure value PE of the exhaust pipe 104 and the pressure value PT of the transfer chamber 103.

FIG. 7 shows a processing flow for the processing division 306 to determine the threshold PTTH of the pressure value PT of the transfer chamber 103, and this processing flow is executed by the processing division 306 at an arbitrary timing. The processing flow includes: Step S400; Step S401; Step S402; Step S403; and Step S404.

Step S400: The processing division (PRC) 306 plots (creates) a graph on the basis of the correlation calculation data (DCC) 308. The correlation calculation data (DCC) 308 is composed of past history data of the pressure value PE of the exhaust pipe 104 and the pressure value PT of the transfer chamber 103 during a predetermined period after the valve 109 is opened. This past history data can be obtained from, for example, the device data (DED) 304. The predetermined period after the valve 109 is opened is not particularly limited, but for example, a time range of 5 seconds to 10 seconds (5 seconds to 10 seconds) after the valve 109 is made in the open state.

Step S401: The processing division (PRC) 306 generates a regression curve RC between the pressure value PT of the transfer chamber 103 and the maximum pressure value of the exhaust pipe 104 on the basis of the created graph (refer to FIG. 11). That is, in this case, the pressure value PE of the exhaust pipe 104 and the pressure value PT of the transfer chamber 103 have a predetermined correlation therebetween, so that the regression curve RC between the pressure value PT of the transfer chamber 103 and the maximum pressure value of the pressure value PE of the exhaust pipe 104 of the processing chamber 102 is created, where the exhaust pipe 104 is to be determined whether anomalous or not. The regression curve RC is represented by, for example, the following formula.

$$\text{Pressure Value } PE \text{ of Exhaust Pipe } 104 = f(P(\text{Pressure Value } PT \text{ of Transfer Chamber } 103))$$

Step S402: The processing division (PRC) 306 selects a predetermined number of upper maximum pressure values (for example, the top 10 maximum pressure values) of the exhaust pipe 104 (refer to FIG. 11).

Step S403: The average value (PEVA10) of the top 10 selected maximum pressure values is calculated (refer to FIG. 11).

Step S404: The processing division (PRC) 306 generates the threshold PETH of the pressure value PE of the exhaust pipe 104 on the basis of the average value (PEVA10) of the selected top 10 maximum pressure values. The threshold PETH can be set to, for example, a pressure value between 85% and 95% of the average value (PEVA10), more preferably a pressure value of about 90% of the average value (PEVA10). The processing division (PRC) 306 also generates the threshold PTTH of the pressure value PT of the transfer chamber 103 by substituting the threshold PETH into the regression curve RC. The thresholds PETH and PTTH are stored in the storage 115 as the threshold data (DTH) 307 by the processing division (PRC) 306.

By setting the threshold PTTH of the pressure value PT of the transfer chamber 103, which is obtained in FIG. 7, variations (noises) shown in a graph 92 of FIG. 10 (the same as the graph 92 of FIG. 9) can be suppressed. A graph 93 in FIG. 10 shows an example of the pressure value PE of the exhaust pipe 104 during the predetermined period TA after the valve 109 is made in the open state (Open) in the case where the threshold PTTH of the pressure value PT of the transfer chamber 103 is used, where the horizontal axis represents time T and the vertical axis represents the pressure PE of the exhaust pipe 104. In other words, it can be seen that the use of the threshold PTTH suppresses the variations in the pressure value PE of the exhaust pipe 104 during the predetermined period TA after the valve 109 is made in the open state (Open).

In other words, by using the pressure value PE of the exhaust pipe 104 during the predetermined period TA after the valve 109 is opened, the variations due to the processing conditions can be suppressed (refer to graphs 91 and 92 in FIG. 9). Furthermore, by setting the threshold value (PTTH) for the pressure value PT of the transfer chamber 103, the variations due to the processing conditions (refer to the graph 91 in FIG. 9) can be improved by about 71% (refer to the graph 93 in FIG. 10). Although the case of using the pressure values has been described so far, the same effect can be obtained by using the statistic amounts of the current value of the first exhaust device 105.

According to the diagnostic device according to the example, it is possible to determine whether or not there is an anomaly in the exhaust devices or the exhaust pipe of the semiconductor manufacturing apparatus while suppressing the variations due to processing conditions.

Although the present invention made by the present inventors has been specifically described above on the basis of the example, it goes without saying that the present invention is not limited to the above-described embodiment and example, and can be variously modified.

REFERENCE SIGNS LIST

100 . . . semiconductor manufacturing equipment system,
101 . . . semiconductor manufacturing apparatus (processing apparatus),
102 . . . processing chamber,
103 . . . transfer chamber,
104 . . . exhaust pipe,
105 . . . first exhaust device,
106 . . . second exhaust device,
107 . . . first pressure gauge,
108 . . . second pressure gauge,
109 . . . valve,
111 . . . diagnostic device,
117 . . . server,
210 . . . wafer stage,
212 . . . sample

The invention claimed is:

1. A diagnostic device for diagnosing a state of a semi-conductor manufacturing apparatus including a processing chamber in which a sample is processed, a transfer unit that is connected to the processing chamber and transfers the sample to the processing chamber, a valve that is disposed between the processing chamber and the transfer unit, an exhaust unit connected to the processing chamber via an exhaust pipe for exhausting the processing chamber, a first pressure gauge connected to the exhaust pipe and configured to measure a first pressure value of the exhaust pipe, and a second pressure gauge connected to the transfer unit and configured to measure a second pressure value of the trans-fer unit, the diagnostic device comprising:

an external interface circuit connected to the semiconduc-tor manufacturing apparatus via a network; and
a processor configured to
receive the first pressure value and the second pressure value from the semiconductor manufacturing appa-ratus via the external interface at a first time;
receive the first pressure value and the second pressure value from the semiconductor manufacturing appa-ratus again via the external interface at a second time which is later than the first time by a predetermined period after the valve is opened; and
determine wherein whether or not there is an anomaly in the exhaust unit or the exhaust pipe regarding the exhaust unit on the basis of the first pressure value at the second time regarding the exhaust unit during the predetermined period after the valve is opened.

2. The diagnostic device according to claim 1,
wherein if a pressure of the transfer unit after the valve is opened is equal to or higher than a predetermined pressure value, the presence or absence of the anomaly is determined.

3. The diagnostic device according to claim 2,
wherein the predetermined pressure value is obtained on the basis of a correlation between a maximum value of the first pressure value regarding the exhaust unit and the second pressure value of the transfer unit in the predetermined period after the valve is opened.

4. The diagnostic device according to claim 1,
wherein an open state of the valve occurs when the sample is transferred from the transfer unit to the processing chamber or when the sample is transferred from the processing chamber to the transfer unit.

5. The semiconductor manufacturing equipment system according to claim 1,
wherein the diagnostic device is a personal computer.

6. A semiconductor equipment manufacturing system to which a semiconductor manufacturing apparatus is con-nected, comprising:
a platform comprising a processor and a memory storing programmed instructions which, when executed by the processor, cause the platform to perform operations for diagnosing a state of the semiconductor manufacturing apparatus, wherein the semiconductor manufacturing apparatus includes a processing chamber in which a sample is processed, a transfer unit that is connected to the processing chamber and transfers the sample to the processing chamber, a valve that is disposed between the processing chamber and the transfer unit, an exhaust unit connected to the processing chamber via an exhaust pipe for exhausting the processing chamber, a first pressure gauge connected to the exhaust pipe and configured to measure a first pressure value of the exhaust pipe, and a second pressure gauge connected to the transfer unit and configured to measure a second pressure value of the transfer unit,
wherein the platform further comprises an external inter-face circuit connected to the semiconductor manufac-turing apparatus via a network, and
wherein the processor is configured to
receive the first pressure value and the second pressure value from the semiconductor manufacturing appa-ratus via the external interface at a first time;
receive the first pressure value and the second pressure value from the semiconductor manufacturing appa-ratus again via the external interface at a second time which is later than the first time by a predetermined period after the valve is opened; and
determine wherein whether or not there is an anomaly in the exhaust unit or the exhaust pipe regarding the exhaust unit on the basis of the first pressure value at the second time regarding the exhaust unit during the predetermined period after the valve is opened.

7. A diagnostic method for diagnosing a state of a semi-conductor manufacturing apparatus that includes a process-ing chamber in which a sample is processed, a transfer unit that is connected to the processing chamber and transfers the sample to the processing chamber, a valve that is disposed between the processing chamber and the transfer unit, an exhaust unit connected to the processing chamber via an exhaust pipe for exhausting the processing chamber, a first pressure gauge connected to the exhaust pipe and configured to measure a first pressure value of the exhaust pipe, and a second pressure gauge connected to the transfer unit and configured to measure a second pressure value of the trans-fer unit, the method comprising:
receiving the first pressure value and the second pressure value from the semiconductor manufacturing apparatus via the external interface at a first time;
receiving the first pressure value and the second pressure value from the semiconductor manufacturing apparatus again via the external interface at a second time which is later than the first time by a predetermined period after the valve is opened; and
determining whether or not there is an anomaly in the exhaust unit or the exhaust pipe regarding the exhaust unit on the basis of the first pressure value at the second time regarding the exhaust unit during the predeter-mined period after the valve is opened.

* * * * *